(12) United States Patent
Lauffer et al.

(10) Patent No.: US 7,827,682 B2
(45) Date of Patent: Nov. 9, 2010

(54) APPARATUS FOR MAKING CIRCUITIZED SUBSTRATES HAVING PHOTO-IMAGEABLE DIELECTRIC LAYERS IN A CONTINUOUS MANNER

(75) Inventors: John M. Lauffer, Waverly, NY (US); Voya R. Markovich, Endwell, NY (US); James J. McNamara, Jr., Vestal, NY (US); Peter A. Moschak, Chenango Forks, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 1357 days.

(21) Appl. No.: 11/110,920

(22) Filed: Apr. 21, 2005

(65) Prior Publication Data

US 2006/0240364 A1 Oct. 26, 2006

(51) Int. Cl.
*H05K 3/10* (2006.01)
*G03F 7/16* (2006.01)

(52) U.S. Cl. .............................. 29/846; 29/852; 29/831; 430/311; 430/315

(58) Field of Classification Search ....................... None
See application file for complete search history.

(56) References Cited

U.S. PATENT DOCUMENTS

| | | | |
|---|---|---|---|
| 4,372,800 A | 2/1983 | Oizumi et al. |
| 4,557,784 A | 12/1985 | Uekita et al. |
| 4,579,612 A | 4/1986 | Held |
| 4,659,425 A | 4/1987 | Eggers et al. |
| 4,902,610 A | 2/1990 | Shipley |
| 5,026,624 A | 6/1991 | Day et al. |
| 5,153,986 A | 10/1992 | Brauer et al. |
| 5,300,402 A | 4/1994 | Card, Jr. et al. |
| 6,015,520 A | 1/2000 | Appelt et al. |
| 6,073,344 A | 6/2000 | Japp et al. |
| 6,175,087 B1 | 1/2001 | Keesler et al. |
| 6,188,027 B1 | 2/2001 | Miller et al. |
| 6,204,453 B1 | 3/2001 | Fallon et al. |
| 6,349,871 B1 | 2/2002 | Card, Jr. et al. |
| 6,388,202 B1 | 5/2002 | Swirbel et al. |
| 6,388,204 B1 | 5/2002 | Lauffer et al. |
| 6,391,210 B2 | 5/2002 | Appelt et al. |
| 6,479,093 B2 | 11/2002 | Lauffer et al. |
| 6,493,861 B1 | 12/2002 | Li et al. |
| 6,495,239 B1 | 12/2002 | Bhatt et al. |
| 6,500,349 B2 | 12/2002 | Andresakis et al. |
| 6,521,844 B1 | 2/2003 | Fuerniss et al. |
| 6,626,106 B2 * | 9/2003 | Peckham et al. ............ 101/424 |
| 6,626,196 B2 | 9/2003 | Downes, Jr. et al. |
| 6,628,531 B2 | 9/2003 | Dadafshar |
| 6,630,630 B1 | 10/2003 | Maezawa et al. |
| 6,630,743 B2 | 10/2003 | Magnuson et al. |
| 6,631,558 B2 | 10/2003 | Burgess |
| 6,631,838 B2 | 10/2003 | Kim et al. |
| 6,638,690 B1 | 10/2003 | Meier et al. |
| 6,638,858 B2 | 10/2003 | Cheng |
| 6,750,405 B1 | 6/2004 | Fallon et al. |
| 7,328,502 B2 * | 2/2008 | Lauffer et al. .................. 29/738 |
| 2002/0045294 A1 * | 4/2002 | Barrett et al. ................ 438/111 |

* cited by examiner

*Primary Examiner*—Daborah Chacko Davis
(74) *Attorney, Agent, or Firm*—Mark Levy; Lawrence R. Fraley; Hinman, Howard & Kattell

(57) ABSTRACT

Apparatus and method for making circuitized substrates using a continuous roll format in which a layer of conductor is fed into the apparatus, layers of photo-imageable dielectric are applied to opposite sides of the conductor layer, thru-holes are formed through the composite, and then metal layers are added over the dielectric and then patterns (e.g., circuit) are formed therein. Several operations are performed in addition to these to form the final end product, a circuitized substrate (e.g., printed circuit board), all while the conductor layer of the product is retained in a solid format, up to the final separation from the continuous layer.

10 Claims, 4 Drawing Sheets

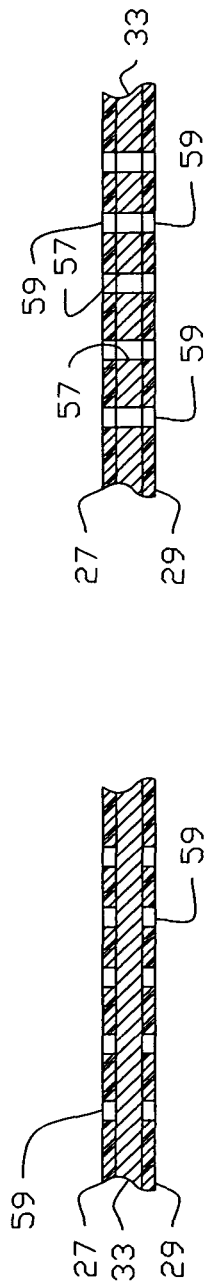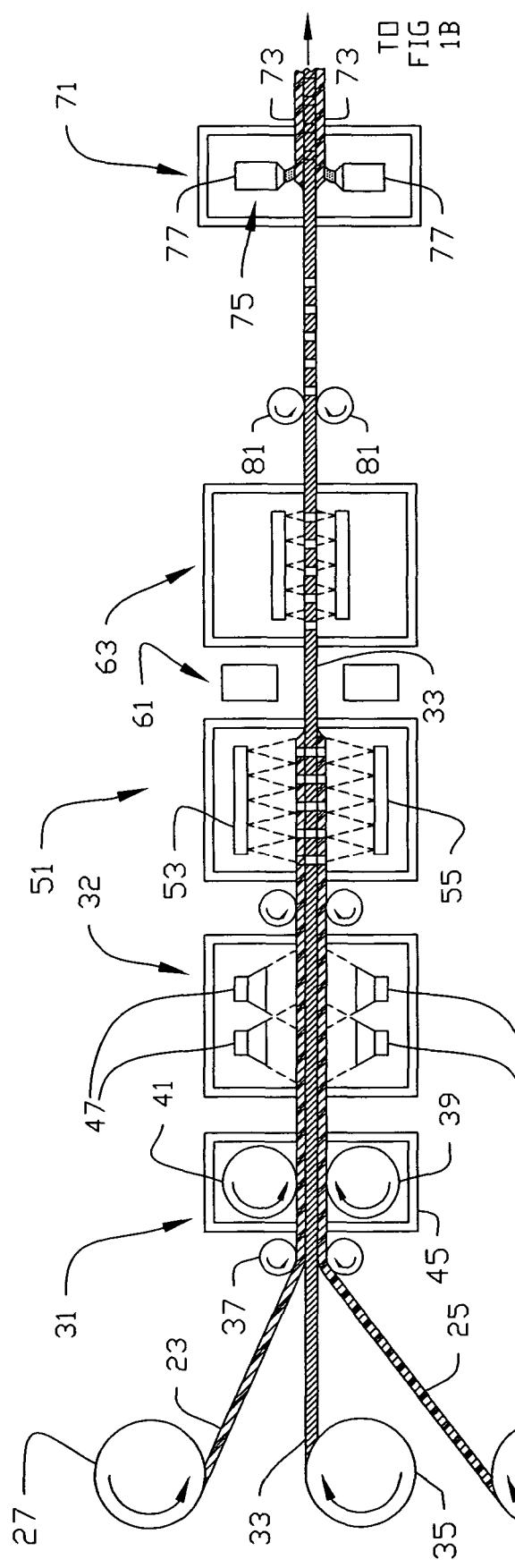

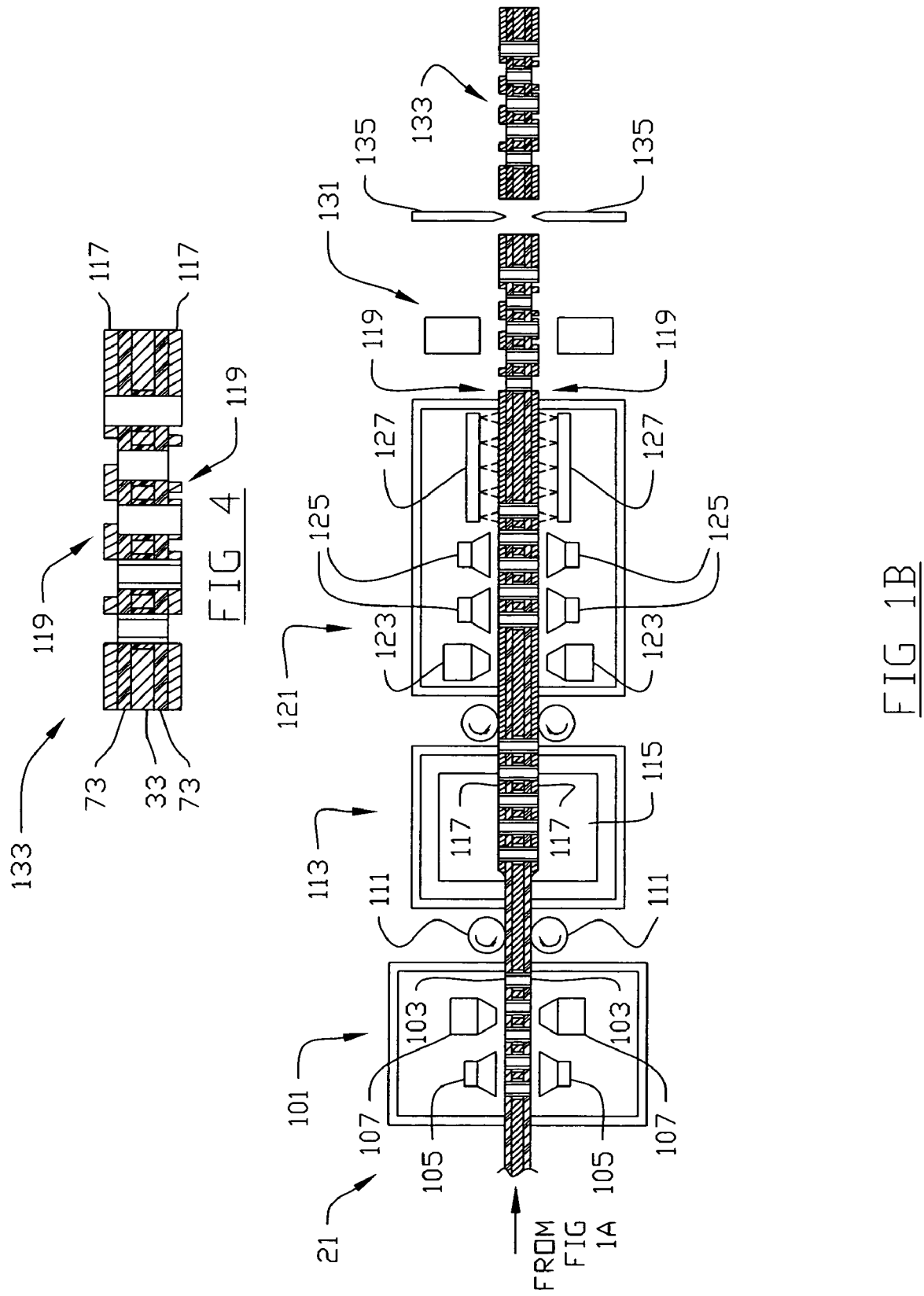

ations in desired areas, the desired areas being those not masked by a previously-applied pattern of plating resist material (e.g., called photo-resist in the printed circuit board field). In conventional manufacture, such plating occurs in a separate department or location of the facility.

APPARATUS FOR MAKING CIRCUITIZED SUBSTRATES HAVING PHOTO-IMAGEABLE DIELECTRIC LAYERS IN A CONTINUOUS MANNER

TECHNICAL FIELD

This invention relates to the manufacture of circuitized substrates such as printed circuit boards, chip carriers, and the like. The invention particularly relates to the manufacture of such substrates in which conductive thru-holes are provided therein, and more particularly to those which utilize photo-imageable dielectric material for one or more of the substrate's dielectric layers.

BACKGROUND OF THE INVENTION

The conventional manufacture of circuitized substrates such as printed circuit boards and chip carriers, especially those of the multi-layered type, involves many individual processes such as etching, plating, lamination, drilling, testing, inspection, etc. Typically, these processes are performed at different locations within the manufacturing facility, requiring shipment of partially completed substrates from one station to another at such different locations. Such transfer is costly and time-consuming, especially when involving multi-layered products, the most common of boards sold today in view of increased operational demands for the products (e.g., computer servers, mainframes, etc.) in which such boards are implemented. In these boards, the board typically consists of parallel, planar, alternating inner layers of insulating substrate material and conductive metal. The exposed outer sides of the laminated structure are often provided with circuit patterns, as with double-sided boards, and the metal inner layer or layers typically contain circuit patterns, or, in the case of internal power planes, layers that are substantially solid. These latter layers also often include clearance openings or other openings if desired.

In multilayer printed circuit boards, it is necessary to provide conductive interconnections between the various conductive layers or sides of the board. This is commonly achieved by providing metallized, conductive thru holes in the board which communicate with the sides and layers requiring electrical interconnection. For some applications, it is desired that electrical connection be made between all or almost all of the conductive layers. It is often desired to also provide electrical connection between the circuitry on one face of the board and one or more of the inner circuit layers. In those cases, "blind vias", passing only part way through the board, are provided. In still another case, such multilayered boards often require internal "vias" which are located entirely within the board's structure and covered by external layering, including both dielectric and conductive. Such internal "vias" are typically formed within a sub-part structure of the final board and then combined with other layers during final lamination of the board. The term "conductive thru-hole" as used in the art may thus include both thru holes that pass entirely through the board (also referred to in the printed circuit field as plated thru holes or PTH's), "blind vias" which extend from an external surface of the board into a specified conductive layer of the board, as well as an "internal via" which is internally "captured" by the board's outer layers.

To provide the desired circuit pattern on the substrate, a variety of even more manufacturing processes are required, examples being those which fall into the broad categories of "subtractive" or "additive" techniques. Common to subtractive processing is the need to etch away (or subtract) metal to expose substrate surface in areas where no circuitry is desired. Additive processes, on the other hand, begin with exposed substrate surfaces (or thin commoning metallization layers for additive electroplate) and build up thereon of metallization in desired areas, the desired areas being those not masked by a previously-applied pattern of plating resist material (e.g., called photo-resist in the printed circuit board field). In conventional manufacture, such plating occurs in a separate department or location of the facility.

Typically, thru-holes are drilled (including mechanically or more recently using lasers) or punched into or through the substrate at desired locations. Drilling or punching provides newly exposed interior surfaces including via barrel surfaces and via peripheral entry surfaces. The dielectric substrate, comprising a top surface, a bottom surface, and at least one exposed via hole surface, consisting partly or entirely of insulating material, is then metallized, generally by utilization of electroless metal depositing techniques, albeit other deposition processes are also known in the field. The formation of such thru-holes also typically occurs at a separate, different location within the manufacturing facility.

In the manufacture of circuitized substrates such as printed circuit boards, one or more dielectric sheets are employed for the substrate. These are typically of an organic material, such as fiberglass-reinforced epoxy resin (also referred to in the field as, simply, "FR4"), polytetrafluoroethylene (e.g., Teflon, a trademark of E.I. DuPont deNemours Company), Driclad material (Driclad is a trademark of the assignee of this invention, Endicott Interconnect Technologies, Inc.), etc. It is also known to utilize photo-imageable materials for such dielectric layers. Typically, when the dielectric materials for the structure are of a photo-imageable material, the material is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imageable material provides a toughened base of dielectric on which the desired electrical circuitry is formed. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. When such photo-imageable dielectric materials are used, these also are applied typically at a separate station within the manufacturing facility, often distant from the others. As indicated above, this invention relates particularly to substrates which utilize one or more photo-imageable dielectric layers as part thereof.

Since the dielectric substrate is nonconductive, in order to plate on the substrate, the substrate is typically "seeded" and one of the above two plating processes then occurs. Typically, these sheets are provided as individual, thin layers of rectangular shape and "stacked" with other layers, including conductive layers, to form the multi-layered final structure, except in the case, of course, of when photo-imageable materials are used in which case these are coated onto the desired sub-composite and, when completed, also stacked up with others sub-composites to form the final multi-layered structure.

Still further manufacturing steps include the afore-mentioned inspection and testing operations. Often, inspections mandate the use of highly precise equipment such as programmed television cameras, in addition to manual inspection, while testing typically is accomplished with complex test apparatus requiring a skilled professional to operate. Both of these operations are also usually performed at different locations in the facility from other manufacturing operations such as defined above.

Examples of methods of making boards, including providing same with such thru holes, are shown and described in the following U.S. Letters Patents, as are examples of various types of boards produced by such methods (including those with photo-imageable dielectric layers as part thereof):

| | |
|---|---|
| 6,015,520 | Method For Filling Holes in Printed Wiring Boards |
| 6,073,344 | Laser Segmentation of Plated Through-Hole Sidewalls To Form Multiple Conductors |
| 6,175,087 | Composite Laminate Circuit Structure And Method Of Forming The Same |
| 6,188,027 | Protection of a Plated Through Hole From Chemical Attack |
| 6,204,453 | Two Signal One Power Plane Circuit Board |
| 6,349,871 | Process For Reworking Circuit Boards |
| 6,388,204 | Composite Laminate Circuit Structure And Methods Of Interconnecting The Same |
| 6,479,093 | Composite Laminate Circuit Structure And Methods Of Interconnecting The Same |
| 6,493,861 | Interconnected Series of Plated Through Hole Vias and Method of Fabrication Therefore |
| 6,495,239 | Dielectric Structure And Method Of Formation |
| 6,521,844 | Through Hole In A Photoimageable Dielectric Structure With Wired And Uncured Dielectric |
| 6,626,196 | Arrangement and Method For Degassing Small-High Aspect Ratio Drilled Holes Prior To Wet Chemical Processing |
| 6,628,531 | Multi-Layer and User-Configurable Micro-Printed Circuit Board |
| 6,630,630 | Multilayer Printed Wiring Board and Its Manufacturing Method |
| 6,630,743 | Copper Plated PTH Barrels and Methods For Fabricating |
| 6,631,558 | Blind Via Laser Drilling System |
| 6,631,838 | Method For Fabricating Printed Circuit Board |
| 6,638,690 | Method For Producing Multi-Layer Circuits |
| 6,638,858 | Hole Metal-Filling Method |
| 6,750,405 | Two Signal One Power Plane Circuit Board |

Various attempts have been made to manufacture at least some parts of circuit boards using what might be referred to as a continuous process. Examples of some of these processes are described below.

In U.S. Pat. No. 4,372,800, issued Feb. 8, 1983, there is described a "continuous" process for producing reinforced resin laminates comprising the steps of impregnating a fibrous substrate with a liquid resin (allegedly free of volatile solvent and capable of curing without generating liquid and gaseous by-products), laminating a plurality of the resin-impregnated substrates into a unitary member, sandwiching the laminate between a pair of covering sheets, and curing the laminate between said pair of covering sheets, without applying appreciable pressure. The patent discusses adjusting the final resin content in the resin impregnated substrate at 10 to 90% by weight, based on the total weight of the impregnated substrate.

In U.S. Pat. No. 4,557,784, issued Dec. 10, 1985, there is described a metal clad laminate produced in "continuous" manner by impregnating a plurality of fibrous substrate with a curable liquid resin, combining the plurality of substrates together and simultaneously laminating a metal foil onto at least one side of said substrates, and curing the laminate. This patent discusses the steps of applying an adhesive onto the metal foil to form a film and heating the film in situ continuously prior to step of the laminating of said metal foil.

In U.S. Pat. No. 4,579,612, issued Apr. 1, 1986, there is described the formation of an "electro-laminate" made of a core of insulating material webs with a high purity electrolytic copper foil on at least one side of the core, for use as a circuit board in electronic equipment. The web of insulating material and the copper foil are led from supply rolls to a laminating machine in out-of-contact relation. Prior to its introduction into the laminating machine, the copper foil is heated to the temperature of the laminating operation so that it is at its maximum thermally expanded length when it contacts the insulating material webs. Further, dust is removed from the copper foil as it enters the laminating machine. The webs and copper foil are moved at the same speed through the laminating machine. After pressing the electro-laminate in the laminating machine, it is moved through a cooling device. Subsequently, the electro-laminate can be wound in a roll or cut into individual lengths.

In U.S. Pat. No. 4,659,425, issued Apr. 21, 1987, there is described a "continuous" method wherein a coating of a solvent-free thermosetting resin is applied to the surface of a metal foil. This resin-coated foil is advanced into contact with a reinforcing cloth sheet layer to form a foil/cloth assembly. The assembly is continuously conveyed between a pair of endless belts revolving in opposite directions with mutually facing surfaces, the belts being heated to the curing temperature of the resin whereby the belts are pressed against the assembly to continuously compact the assembly and cure the resin to form a composite product which can then be circuitized. This partial process does not include many of the essential steps such as defined above which are necessary for boards of more complex construction, especially those needing conductive thru-holes as part thereof.

In U.S. Pat. No. 4,902,610, issued Feb. 20, 1990, there is described a process for forming a multilayer printed circuit board comprising providing a non-conductive carrier having a circuit pattern over at least one of its surfaces, applying a first permanent photo dielectric coating over the circuit pattern, exposing the permanent photo dielectric coating to activating radiation in an image pattern comprising an array of openings at locations where interconnections are desired and developing the imaged photo dielectric coating to provide photo-formed openings, selectively providing an electro-less plating catalyst within the photo-formed openings and plating electro-less copper onto the plating catalyst to render the photo-formed openings conductive, applying a permanent photo mask over the metallized layer of interconnections, exposing the permanent photo mask to activating radiation in an image pattern comprising an array of conductors and interconnections at desired locations, developing the imaged photo mask to provide photo-formed conductor lines where conductors are desired and photo-formed openings where interconnections are desired and selectively providing an electro-less plating catalyst within the photo-formed openings and plating electro-less copper onto the electro-less plating catalyst to render the photo-formed openings conductive and repeating the process sequentially until the desired number of layers are formed.

In U.S. Pat. No. 5,153,986, issued Oct. 13, 1992, there is described a method of fabricating a multilayer electronic circuit package. The multilayer circuit package has at least one layer that is a circuitized, polymer encapsulated metal core. According to the method of the invention a metal foil is provided for the metal core of the layer. This metal core foil may be provided as a single unit or in a roll to roll, process. The thru holes are drilled, etched, or punched through the metal foil. An adhesion promoter is then applied to the perforate metal foil for subsequent adhesion of polymer to the foil. The dielectric polymer is then applied to the perforate metal foil core by vapor depositing, chemical vapor depositing, spraying or electrophoretically depositing, a thermally processable dielectric polymer or precursor thereof onto exposed surfaces of the perforate metal foil including the walls of the thru holes. The dielectric polymer or precursor thereof is then thermally processed to form a conformal dielectric, polymeric coating on surfaces of the perforate metal foil, including the interior surfaces of the thru holes. This dielectric, polymeric coating may then be circuitized, and coated with an adhesive for lamination to the next adjacent layer. After lamination, one or more chips are attached to the completed package.

In U.S. Pat. No. 6,388,202, issued May 14, 2002, there is described a high density multi-layer printed circuit board formed by building additional dielectric and metallization layers over a central core of conventional laminate construction. The central core has a metallization pattern on at least one surface. A photo-imaged dielectric layer is deposited on one side of the central core and overlies the metallization pattern. Vias are formed in this dielectric layer using a photo-imaging process, and an additional metallization pattern on this layer is electrically connected to the underlying metallization pattern through the vias. A non-photo-imageable dielectric layer is deposited on the other side of the central core. Vias are formed in this dielectric layer by a laser drilling process, and an additional metallization pattern on this layer is electrically connected to an underlying metallization pattern through these laser drilled vias.

In U.S. Pat. No. 6,391,210, issued May 21, 2002, there is described a process for the manufacture of a multi-level circuit board having a first-level circuitry pattern on at least one side. The process comprises applying a permanent photo-imageable dielectric over the first-level circuitry pattern; exposing the permanent photo-imageable dielectric to radiation; laminating a conductive metal layer to the dielectric; making holes in the conductive metal layer and dielectric by mechanical drilling or by laser or plasma ablation; and making a second-level circuitry pattern and filling the holes with a conductive material to electrically connect the first and second layers of circuitry. A further process described comprises making a prototype having the above structure in which the holes are manufactured by mechanical drilling or by laser or plasma ablation, evaluating the prototype, and then manufacturing a commercial board having essentially the same structure and materials of construction as the prototype, but wherein the holes are manufactured using photo-imaging processes.

In U.S. Pat. No. 6,500,349, issued Dec. 31, 2002, there is described a "continuous" process for forming multilayer circuit structures which includes applying and curing a film forming polymer onto the matte side of a copper foil. The opposite (shiny) side of the foil is cleaned, and applied with a photoresist which is then dried. The photo-resist is exposed, and developed to remove the non-image areas, while leaving the image areas. The foil under the removed non-image area is then etched to form a copper pattern, and the remaining photo-resist is removed. The foil is then cut into sections, and then punched with registration holes. The copper pattern is then treated with a bond enhancing treatment, inspected for defects, and laminated onto a substrate to form a multilayered circuit structure.

The present invention represents a new and unique method of forming circuitized substrates having conductive thru holes therein, in comparison to those above and other processes known in the art. Significantly, the method as defined herein involves the making of a circuitized substrate beginning from providing layers of conductor and dielectric material on through circuitizing, all on a continuous format, and then segmenting the circuitized elements to produce individual substrates. Such substrates can then be bonded, e.g., laminated, to other similar substrates to form a larger, multi-layered structure. It is believed that such a method will represent a significant advancement in the art.

OBJECTS AND SUMMARY OF THE INVENTION

It is, therefore, a primary object of the present invention to enhance the circuitized substrate art by providing a new and unique method of producing such substrates in which photo-imageable dielectric materials are used.

It is another object of the invention to provide such a process in which several conductive thru holes are formed to interconnect various conductive layers of the substrate.

It is still another object of the invention to provide such a process which can be implemented using conventional printed circuit board technologies.

According to one aspect of the invention, there is defined a method of making a plurality of circuitized substrates comprising providing a first conductive layer having first and second opposing surfaces, forming holes within said first conductive layer which extend through the thickness of the first conductive layer, depositing photo-imageable dielectric material on the first and second opposing surfaces of the first conductive layer and within the holes extending through the thickness of the first conductive layer, forming first and second patterns within the photo-imageable dielectric material on both opposing surfaces of the first conductive layer, respectively, each of these patterns including openings therein which align with the first conductive layer's holes, providing electrically conductive material within the openings and on selected parts of the external surfaces of the photo-imageable material to render these openings electrically conductive and to form circuit patterns on the selected parts of the surfaces of photo-imageable material, and thereafter segmenting the first conductive layer, photo-imageable material on the opposing surfaces of the first conductive layer, and the circuit patterns on the photo-imageable material to define a plurality of circuitized substrates each having a pattern of conductive thru-holes therein, all of these steps being performed while the first conductive layer is in the form of a continuous, solid member.

According to another aspect of the invention, there is defined a method of making a plurality of circuitized substrates comprising providing a first conductive layer having first and second opposing surfaces, forming holes within the first conductive layer which extend through the thickness of the first conductive layer, depositing photo-imageable dielectric material on the first and second opposing surfaces of the first conductive layer and within the holes extending through the thickness of the first conductive layer, forming first and second patterns within the photo-imageable dielectric material on both opposing surfaces of the first conductive layer, respectively, each of these patterns including openings therein which align with the first conductive layer's holes, providing electrically conductive material within the openings to render these openings electrically conductive, and thereafter segmenting the first conductive layer and photoimageable material on the opposing surfaces of the first conductive layer having the conductive material within the openings thereof to define a plurality of circuitized substrates each having a pattern of conductive thru-holes therein, all of these steps being performed while the first conductive layer is in the form of a continuous, solid member.

According to yet another aspect of the invention, there is provided an apparatus for making a plurality of circuitized substrates, the apparatus comprising a device for feeding a first conductive layer having first and second opposing surfaces, a device for forming holes within the first conductive layer which extend through the thickness of the first conductive layer, a device for depositing photo-imageable dielectric material on the first and second opposing surfaces of the first conductive layer and within the holes extending through the first conductive layer, a device for forming first and second patterns within the photo-imageable dielectric material on both of the opposing surfaces of the first conductive layer, respectively, each of these patterns including openings therein which align with respective ones of the holes within the first conductive layer, a device for providing electrically conductive material within the openings and on selected parts of the external surfaces of the photo-imageable material to render these openings electrically conductive and to form circuit patterns on the selected parts of the surfaces of photo-imageable material, and a segmenting device for segmenting the first conductive layer, the photo-imageable material on said opposing surfaces of said first conductive layer, and the circuit patterns on the photo-imageable material to define a plurality of circuitized substrates each having a pattern of conductive thru-holes therein, all of the steps being performed while the first conductive layer is in the form of a continuous, solid member (excluding of course when it has the formed holes therein).

According to still another aspect of the invention, there is provided an apparatus for making a plurality of circuitized substrates, the apparatus comprising a device for feeding a first conductive layer having first and second opposing surfaces, a device for forming holes within the first conductive layer which extend through the thickness of the first conductive layer, a device for depositing photo-imageable dielectric material on the first and second opposing surfaces of the first conductive layer and within the holes extending through the first conductive layer, a device for forming first and second patterns within the photo-imageable dielectric material on both of the opposing surfaces of the first conductive layer, respectively, each of these patterns including openings therein which align with respective ones of the holes within the first conductive layer, a device for providing electrically conductive material within the openings to render these openings electrically conductive and a segmenting device for segmenting the first conductive layer, the photo-imageable material on said opposing surfaces of the first conductive layer having the conductive material within the openings thereof to define a plurality of circuitized substrates each having a pattern of conductive thru-holes therein, all of the devices performing these steps while the first conductive layer is in the form of a continuous, solid member (excluding of course when it has the formed holes therein).

BRIEF DESCRIPTION OF THE DRAWINGS

FIGS. 1A and 1B illustrate an apparatus for forming a circuitized substrate in a continuous format according to one aspect of the invention, the apparatus also illustrating the steps of making such a substrate;

FIGS. 2-4 illustrate enlarged, partial views of various parts of the continuously formed circuitized substrate during the method of manufacture thereof using the apparatus in FIGS. 1A and B;

BEST MODE FOR CARRYING OUT THE INVENTION

Figure 5:
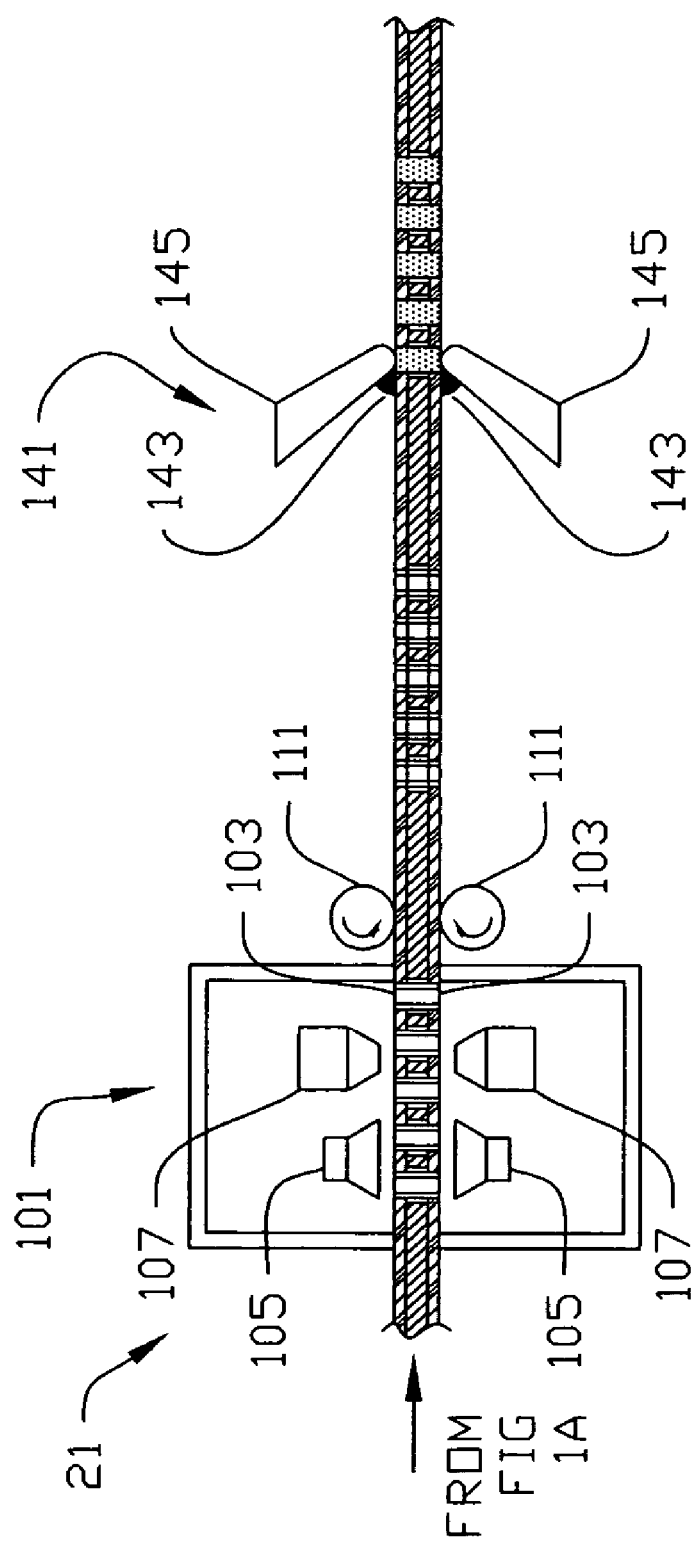
FIG. 5 is a partial view of an apparatus for forming a circuitized substrate according to an alternative embodiment of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "continuous" as used herein when defining a process is meant a process in which all of the steps to manufacture a circuitized substrate having at least one conductive layer and two dielectric layers are performed with the at least one conductive layer being in the form of a continuous layer, up to final segmenting to define the final substrate's dimensions. All steps are performed while the conductive layer remains as provided from its original source (e.g., a roll), without segmenting occurring until the last step.

By the term "circuitized substrate" as used herein is meant to include substrates having at least two (and preferably more) dielectric layers comprised of photo-imageable material and at least one (and preferably more) metallurgical conductive layer(s). The dielectric layers taught herein may be typically about 2 mils to about 4 mils thick, but also thicker or thinner if desired. Examples of circuitized substrates include printed circuit boards (or cards) and chip carriers.

In FIGS. 1A-1B, there is shown an apparatus 21 for making a circuitized substrate according to one aspect of this invention. As indicated herein, apparatus 21 is able to make this substrate in a continuous manner, meaning that at least one conductive layer of the final substrate remains in the form of a continuous, substantially solid member (excluding the provision of holes therein as described) throughout the entire processing thereof, up to the final segmenting step when individual substrates are removed from the continuous line. One of the most significant features of this invention is the ability to provide various layers of the substrate using photo-imageable materials while also forming large numbers of high density patterns of holes within the substrate line in patterns associated with each of the final substrates being produced. This combination of processes is attainable while also performing other, individual processes (if required) such as etching, exposure, testing, and the like as needed.

In FIG. 1A, first and second dielectric layers 23 and 25 are provided from individual roll members 27 and 29, respectively, to a first bonding station 31. As part of this feeding operation, a conductive layer 33 is also fed, also from a roll member 35 such that it will be sandwiched between the upper and lower dielectric layers 23 and 25. Preferably, these three layers are provided to a first set of feed rollers 37 which draw the layers together and feed these into the bonding station 31. In a preferred embodiment, the bonding station 31 includes at least one pair of opposed, heated rollers 39 and 41. Each of these rollers is preferably heated to a predetermined temperature (in one embodiment, to a range of from about 75 degrees Celsius (C.) to about 130 degrees C.) and are comprised of rubber coated steel cored drums. Various means may be utilized to heat the rollers 39 and 41, the preferred means being electrical resistive heaters contained within the steel core of the roller. Each of the rollers 39 and 41 are shown as being positioned within a housing 45, but this is not a necessary requirement. The rollers exert a force within the range of from about 10 pounds per square inch (p.s.i.) to about 80 p.s.i. on the three layers as these pass there-through. As a result, each of the outer dielectric layers 23 and 25 is firmly bonded to the interim, common conductive layer 33.

In a preferred embodiment, each of the dielectric layers is comprised of a conventional photo-resist, a preferred example being Riston EtchMaster photo-resist, available from E.I. DuPont de Nemours and Company. Each layer preferably possesses a thickness within the range of from about 0.6 mils to about 2.0 mils. The corresponding interim conductive layer is preferably copper and has a thickness of from about 0.5 mils to about 3 mils. Significantly, this conductive layer will remain as a solid, integral member (except when holes are provided therein as part of this processing) through-out the entire method defined herein, up to the final severance of it and associated dielectric and conductive layers (if any) from the continuous format shown.

Once compression (lamination) of the three layers has occurred, a bonded structure now results and is now passed on to the next station 32. At station 32, the bonded structure comprised of these three layers (with the photo-resist forming the outer layers) is subjected to an exposure step in which the photo-resist material is exposed to define a specific hole pattern therein. These holes (59, in FIG. 2, in which the structure is shown as it departs station 32) are to eventually define the pattern of the clearance holes within the interim copper layer, such clearance holes necessary to allow connection through the conductive layer from at least one additional conductive layer to another, if desired. It is necessary to define the hole 59 patterns in the outer photo-resist layers to define the copper layer's pattern, as the photo-resist is primarily used for this purpose and will be eventually discarded (stripped away). The exposure operation conducted at station 32 is performed using known exposure lamps, shown by the numerals 47, it being understood that various masking structure (not shown) is also required and well within the knowledge of one skilled in the art.

Following the exposure, the composite structure is moved to station 51 in which development of the photoresist and etching of the clearance holes within the composite is performed. Development is accomplished using a conventional developer known in photolithographic processing, the developer deposited on the external surface and thus serving to remove the corresponding portions of the photoresist material and expose the desired clearance hole locations thereunder. During the etch procedure, a conventional etchant (preferably cupric chloride) is sprayed onto the composite using spray devices 53 and 55. The structure so formed, including the holes 59 and now etched openings 57, is partially illustrated in FIG. 3. The corresponding photoresist 23 and 25, having the developed (removed) holes 59, is also shown. As mentioned, FIG. 2 illustrates the structure of the composite following the photoresist material removal to define these openings 59 and prior to the etching to form the holes 57.

Although etching is defined as the means of providing clearance holes 57, the invention is not limited thereto because other procedures, including mechanical or laser drilling and punching are possible, these methods not requiring the use of photo-resist layers 23 and 25.

Following this, the composite is further advanced to optical test device 61 in which highly precise television cameras inspect the formed apertures, now found only within the common conductive layer 33. As part of the aforementioned develop and etch process, the outer dielectric layers 23 and 25 have been entirely removed (stripped) from the copper conductive layer such that only the copper layer is now advanced. Following optical inspection, the conductive layer 33 is continuously advanced to the next station 63 during which an adhesion treatment procedure is performed. This optional procedure is utilized to prepare the outer surface of the copper layer for subsequent bonding to the subsequent photo-imageable dielectric layers being applied. In a preferred embodiment, this treatment at station 63 involves the exposure of these surfaces to an oxide material (e.g. sodium chlorite, typically used in combination with other chemicals) or to what is known as a BondFilm procedure in which a known material (called BondFilm) is applied and the exterior surfaces roughened to an extent necessary to enhance the subsequent bonding. Such material is currently available on the marketplace under this name from Atotech Deutschland GmbH, an international company having a U.S.A. business address at 1750 Overview Drive, Rock Hill, S.C., During this procedure, the copper layer is exposed to the treatment material for a period of from about 5 seconds to about 2 minutes while the material is at a temperature of from about 20 degrees C. to about 40 degrees C.

The treated conductive layer 33 is then passed to station 71 in which photo-imageable dielectric material 73 is deposited on opposite sides of layer 33, including within the formed holes 57. Deposition is accomplished using opposed dispensing apparatus 75, preferably containers 77 with suitable nozzles thereon which direct the liquid photo-imageable material in the direction intended. Notably, the lower container projects liquid material upwardly, which liquid then maintains contact with the undersurface of layer 33 on to subsequent processing. The preferred photo-imageable material applied at station 71 is advanced solder mask (also known simply as "ASM") material available under the name Dyna-Via, from the Rohm and Haas Company. Other photo-imageable materials include those sold under the trade names PSR4000 BN and PSR4000-AUS703, available from Taiyo. This deposition occurs within the housing at station 71 at a temperature within the range of from about 20 degrees C. to about 30 degrees C., with the photo-imageable material at a viscosity of about 30 to about 110 pascal-seconds (pa-s). As stated, the material also enters the holes 57 of the copper layer and substantially fills same. Once applied at station 71, and when moving on to the next station (101), the photo-imageable material has a thickness of about 1 mil to about 3 mils on each opposing side of layer 33.

In an alternative embodiment, it is possible to apply the photo-imageable material in dry film form, rather than liquid as shown. If the case, the film is provided from individual roll members (similar to roll members 27 and 29), each film dispensed from a roll member on either the upper or lower side of layer 33, much as the dry film dielectric materials 23 and 25 are provided. This pair of roll members would be located adjacent the shown feed rollers 81 and would feed their respective films to station 71 similarly to the feed of dielectric layers 23 and 25. In this case, however, station 71 will include compression rollers similar to rollers 39 and 41 at station 31. Similar pressures and temperatures would be utilized, and, as with the liquid version, portions of the dry film material will penetrate within the openings 57. These feed roll members and compression rollers are not shown for ease of explanation, but are understood from the above description and associated roll structures.

In either the preferred or alternative embodiments described above, it is understood that additional operations might be required in processing of the photo-imageable dielectric material, depending on the material that is used. These additional operations could include drying operations or post expose bakes. These drying and bake operations could be performed with in-line convection or infrared ovens, which are not shown in the FIGS.

The next step in the operation, performed at the aforementioned station 101, involves the exposure and development of patterns within each of the opposing photo-imageable layers, each of these patterns including openings 103 which align with respective holes 57 in interim layer 33. Exposure and development of these opposing patterns is performed using lamps 105, much the same as lamps 47 served to expose photo-resist 23 and 25. Following exposure, a developer solution (not shown) is dispensed from container 107 to remove exposed (or non-exposed, depending on whether negative or positive photo-imaging occurs) portions of the photo-imageable material to thus define openings 103. It is now seen in FIG. 1B that the aligned holes 57 in layer 33 and the openings 103 in the outer photo-imageable layers 73 define a plurality of holes which extend entirely through the thickness of the three-layered structure as it leaves station 101. Notably, some of the photo-resist material will remain on the internal walls of holes 57, to provide electrical insulation between the eventual conductive material(s) to be deposited in these holes and the conductive layer. That is, such insulation assures that the conductive thru-holes to be formed in this structure do not electrically couple to layer 33, as this layer is preferably to be used as a power layer in one embodiment of the final product provided herein. This is not meant to limit the invention, of course, as it is possible to use layer 33 as a signal layer and couple selected ones of the formed thru-holes to same. Alternatively, it is also possible to use layer 33 as a ground layer and selectively couple some of the thru-holes thereto should it be desirable in the end product to ground the layer (e.g., signal lines) to which the thru-hole is also coupled. Various other possibilities are also within the scope of this invention, as understood by one of skill in this art. Further description is not considered necessary.

In one example, a total of 20,000 holes may be provided at station 101 for each of the circuitized substrates being formed, each of these holes including a diameter of only from about 1 mil to about 8 mils, and provided at spacings from one another as little as 5 mils. It is to be understood that one of the most important aspects of this invention is the ability to provide such large numbers of holes in such close patterns all in a continuous process in which other important steps are also being performed. Of further significance, the use of photo-imageable materials and photolithographic processing (exposure, development, etc.) thereof avoids the necessity of using mechanical drills or even lasers to provide the holes at this location of apparatus 21.

Following the photolithographic processing at station 101, the apertured, three-layered structure is moved by advance rollers 111 to the next station 113, at which the holes are seeded with a conventional seed material known in the art (e.g., one example being a solution of stannous chloride and palladium chloride) to enhance subsequent metal application. Following seed, the holes are flash plated using an electro-less copper plating solution. Plating may continue with conventional plating procedures, two preferred examples being full build electro-less copper and electrolytic copper. The plating device is represented, generally, by numeral 115 at station 113. During the plating operation, the preferred plated metal is copper, deposited at a thickness of from about 0.2 mils to about 1.5 mils. Significantly, plated conductive material is also deposited on the upper and lower surfaces of the three-layered structure at station 115, thereby producing a five-layered structure as it leaves station 113, with the outer conductive layers (117) being substantially solid. Each outer conductive layer has a thickness of about 0.2 mils to about 1.5 mils. It is understood that these outer conductors will serve as a conductive layer in the final product, perhaps as signal layers or even possibly as ground or power, depending on the operational requirements for the end product.

Following plating, the composite structure is advanced to the next station, 121, during which the final outer circuit patterns 119 will be defined within the external conductive layers 117. In a preferred embodiment, this is accomplished using known photolithographic processing such as performed earlier in the process. If so, a second photo-resist (not shown) is supplied (i.e., using nozzles 123), followed by exposure (i.e., using lamps 125), and subsequent development and etch (i.e., using etching apparatus 127). The preferred photo-resist and etchants may be the same as used at stations 31 and 51. Following this operation, a final optical test, again using precise television cameras, is performed at station 131.

Finally, the respective circuitized substrates, represented by the numeral 133 and also seen in larger detail in FIG. 4, are separated (preferably using a shearing device in which opposing blades 135 are used). In one example, each of the circuitized substrates possesses a width of about 18 inches and a length of 24 inches. Each includes the described common interim conductive layer 33, having its clearance holes therein such that the thru-holes as plated in station 113 are used and which are electrically isolated from the clearance holes to interconnect the opposite, formed circuit patterns now within the outer conductive layers 75, unless the foregoing alternative connections are desired.

Although it is shown in FIGS. 1A and 1B to apply only one pair of conductive and dielectric layers to the opposite sides of copper layer 33, the invention is not so limited. Specifically, it is also within the scope of this invention to add additional photo-imageable dielectric and conductive layers at subsequent stations, depending on the operational requirements of the end product. If the case, the initial layers shown at station 121 will be processed as defined and a second photo-imageable dielectric layer will then be applied, using a similar structure as shown at station 71. This added deposition would occur immediately following inspection at station 131, following which exposure and development, similar to that defined above, would occur. Following this, added conductive layers would be provided on the photo-imageable third and fourth layers, and in any holes formed therein, the conductive layers forming, in one embodiment, circuit patterns having designated line and hole patterns. The apparatus to perform these added operations is preferably similar to that used above, so further description is not necessary. The thru-holes formed at station 101 could also be provided through the complete, now several layered structure, the initial grouping provided in the three layered structure at station 101 not being provided until this final phase. That is, the thru holes which extend entirely through the multi-layered structure will not be provided until all dielectric and conductive layers are bonded and circuitized. Only one hole formation process for such entire grouping of thru-holes is thus necessary (or desired).

It is understood that one of the unique teachings of the present invention is the ability to not only provide several similar circuitized substrates 133, each having the same hole pattern and conductive circuit patterns on the exterior surfaces thereof, but also to provide circuitized substrates with different clearance holes and external circuit patterns thereon. This is accomplished by appropriate software to coordinate the respective hole-forming operations and circuit pattern forming steps.

In FIG. 5, there is shown an alternative embodiment of making circuitized substrates in accordance with the teachings of this invention. In FIG. 5, the composite structure as passed through station 101 passes to a new station 141 rather than directly into station 113, new station 141 designed to deposit electrically conductive paste 143 within the provided holes in the composite. (In one embodiment, it is preferred to clean these holes of any possible photo-imageable material residue, in which case such cleaning occurs using conventional hole-cleaning equipment (not shown)) In a preferred embodiment, paste 143 is provided using a conventional squeegee, as represented by the numerals 145, and applied from opposite surfaces of the structure as shown. In a preferred embodiment, the conductive paste as deposited may be a silver, copper, gold or tin filled polymer such as that available from National Starch and Chemical Company under the product name Ablestick 8175, or that provided by E.I. duPont deNemours & Company under product name CB100. This may also be an organo-metallic paste such as Ormelink paste available from Ormet Circuits, Inc. Although the structure removed from station 101 includes holes that are preferably clear of contaminants, it is also within the scope of the invention to seed and plate these holes prior to the deposition of the defined electronic paste. Should this be desired, the same metals as described above with respect to station 113 are provided, preferably at the thicknesses defined.

Following paste deposition, the three-layered composite is moved next to inspection station 131 (shown in FIG. 1B) and then to severance, preferably using shearing devices 135, as was done for the substrate in FIGS. 1A-1B.

It is thus understood that in the latter embodiment (paste version), the resulting structure in its simplest version will comprise the common, interim copper layer 33, the two outer photo-imageable layers, and the paste, the latter filling the thru-holes which extend entirely through the thickness of the substrate. In one embodiment, the resulting circuitized substrate will serve as an interconnector structure, specifically designed for interconnecting conductors of opposing, other circuitized substrates such as printed circuit boards, chip carriers and the like, including other substrates as produced using the teachings herein.

Figure 6:
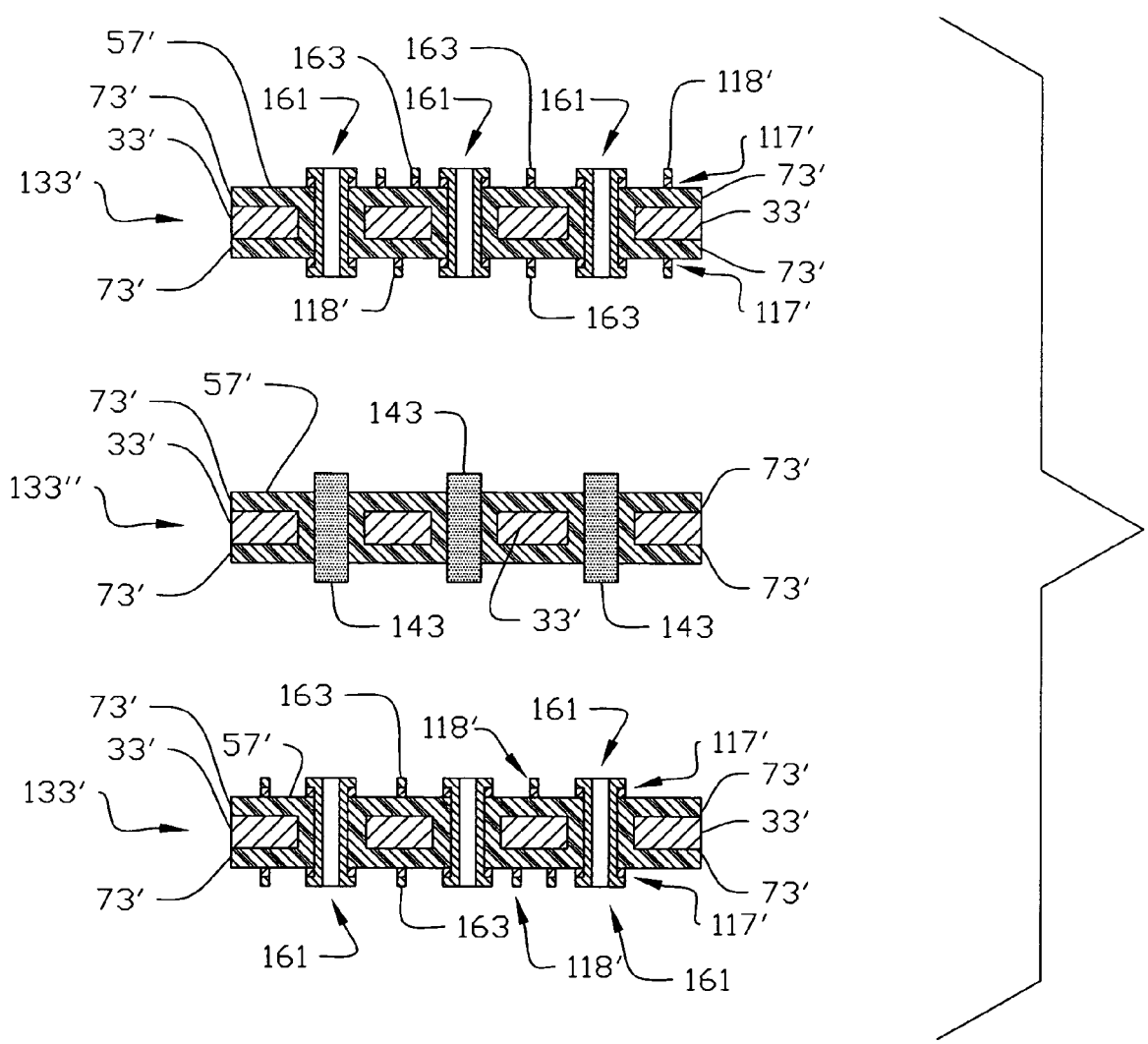
FIG. 6 is an exploded view, on a much enlarged scale over the above FIGS., illustrating the step of bonding various circuitized substrates formed using the apparatus and method taught herein together to form a larger, multi-layered circuitized substrate.

FIG. 6 represents much enlarged examples of the circuitized substrates which can be produced using the teachings of this invention. In FIG. 6, the upper and lower substrates 133' are similar to those provided using the apparatus in FIGS. 1A-1B. Specifically, each includes a common conductive layer 33' having the defined clearance openings 57' therein. Each further includes the outer photo-imageable layers 73', in addition to conductive thru-holes 161, shown much clearer here than in previous FIGS. The thru-holes extend entirely through the thickness of the substrate to couple the outer conductive layers to one another. It is noted that in FIG. 6, each of these circuitized substrates 133' includes two conductive layers 117' (similar to layers 117 defined above) and 118' on the outer surfaces thereof. This may be accomplished using the teachings of the invention by providing only partial removal of the copper outer layer having the defined. As further seen in FIG. 6, each of these external circuit patterns also include individual conductive elements 163 which may, in the final structure, serve as signal lines.

Also seen in FIG. 6 is an example of the circuitized substrate, represented by the numeral 133" as produced from the embodiment shown in FIG. 5. This structure also includes the common conductive layer 33' and its corresponding clearance holes 57, as well as the external photo-imageable layers 73'. However, the circuitized substrate 133" in FIG. 6, as mentioned, does not include the above-defined external conductive patterns thereon, but instead only includes a series of holes having the described conductive paste 143 therein.

In FIG. 6, the three illustrated circuitized substrates are aligned in the manner shown such that the conductive paste as shown aligns with corresponding opposing pairs of thru-holes. The composite structure is then laminated using conventional lamination processing and a composite structure formed, of a multi-layered configuration having the defined seven conductive layers therein with respective conductive layers being coupled through the interim circuitized substrate 133" by the conductive paste. In one example, the lamination procedure to bond these three substrates was conducted at a temperature of about 190 degrees C. and a corresponding pressure of about 500 p.s.i. The resulting structure, in one example of the invention, possessed an overall thickness of only about 15 mils. It may also possess width and length dimension similar to those described for the individual substrates defined above, this resulting structure being a combination of same aligned in a vertical orientation.

Although it is shown in FIG. 6 that the conductive thru-holes are not physically coupled to one or both of the interim conductive layers 33', it is possible that this be accomplished, e.g., should the interim conductive layer function as a ground and it is desired to ground one or more of these thru-holes and the remaining conductive element (e.g., a signal line) which is electrically coupled thereto.

Thus there has been shown and described a new and unique method of making a circuitized substrate in which the substrate is formed during a continuous process in which the substrate's conductive layer remains a solid sheet (except when defined patterns of holes or openings are provided therein) throughout the entire operation. Additional conductive layers are also possible. Significantly, the final structures are provided during which precise hole formation is possible using photo-imageable materials as the substrate's dielectric, in addition to other precise operations such as circuit pattern formation and the like. This method, and the defined apparatus for accomplishing same, thus represents a significant advancement in the art.

While there have been shown and described what are at present the preferred embodiments of the invention, it will be obvious to those skilled in the art that various changes and modifications may be made therein without departing from the scope of the invention as defined by the appended claims.

What is claimed is:

1. An apparatus for making a plurality of multilayer circuitized substrates, said apparatus comprising:

a device for continuously feeding a first conductive layer having first and second opposing surfaces;

a device for forming holes within said first conductive layer which extend through the thickness of said first conductive layer;

a device for creating a dielectric layer of said circuitized substrates by depositing photo-imageable dielectric material on said first and second opposing surfaces of said first conductive layer and within said holes extending through said thickness of said first conductive layer;

a device for forming first and second patterns within said photo-imageable dielectric material on said opposing surfaces of said first conductive layer, respectively, each of said patterns including openings therein which align with said holes within said first conductive layer;

a device for providing electrically conductive material within said openings and on selected parts of the external surfaces of said photo-imageable material on said first and second opposing surfaces of said first conductive layer, respectively, to render said openings electrically conductive and to form circuit patterns on said selected parts of said surfaces of said photo-imageable material; and a segmenting device for segmenting said first conductive layer, said dielectric layer comprising said photo-imageable material on said opposing surfaces of said first conductive layer, and said circuit patterns on said photo-imageable material to define a plurality of circuitized substrates each having a pattern of conductive thru-holes therein, all of said steps being performed while said first conductive layer is in the form of a continuous, solid member.

2. The apparatus of claim 1 wherein said device for feeding said first conductive layer comprises a feed roller.

3. The apparatus of claim 1 wherein said device for forming first and second patterns within said photo-imageable dielectric material on said opposing surfaces of said first conductive layer comprises photolithographic processing apparatus.

4. The apparatus of claim 1 wherein said device for providing electrically conductive material within said openings and on selected parts of the external surfaces of said photo-imageable material on said first and second opposing surfaces of said first conductive layer comprises a plater.

5. The apparatus of claim 1 wherein said segmenting device comprises a shear mechanism.

6. An apparatus for making a plurality of circuitized substrates, said apparatus comprising:

a device for continuously feeding a first conductive layer having first and second opposing surfaces;

a device for forming holes within said first conductive layer which extend through the thickness of said first conductive layer;

a device for creating a dielectric layer of said circuitized substrates by depositing photo-imageable dielectric material on said first and second opposing surfaces of said first conductive layer and within said holes extending through said thickness of said first conductive layer;

a device for forming first and second patterns within said photo-imageable dielectric material on said opposing surfaces of said first conductive layer, respectively, each of said patterns including openings therein which align with said holes within said first conductive layer;

a device for providing electrically conductive material within said openings to render said openings electrically conductive; and a device for segmenting said first conductive layer and said dielectric layer comprising said photo-imageable material on said opposing surfaces of said first conductive layer having said electrically conductive material within said openings thereof to define a plurality of circuitized substrates each having a pattern of conductive thru-holes therein, all of said steps being performed while said first conductive layer is in the form of a continuous, solid member.

7. The apparatus of claim 6 wherein said device for feeding said first conductive layer comprises a feed roller.

8. The apparatus of claim 6 wherein said device for forming first and second patterns within said photo-imageable dielectric material on said opposing surfaces of said first conductive layer comprises photolithographic processing apparatus.

9. The apparatus of claim 6 wherein said device for providing electrically conductive material within said openings comprises an electrically conductive paste dispenser.

10. The apparatus of claim 6 wherein said segmenting device comprises a shear mechanism.

* * * * *